(12) United States Patent
Weller

(10) Patent No.: US 6,847,909 B2
(45) Date of Patent: Jan. 25, 2005

(54) SYSTEM AND METHOD FOR GENERATING A SHMOO PLOT BY TRACKING THE EDGE OF THE PASSING REGION

(75) Inventor: Christopher Todd Weller, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 112 days.

(21) Appl. No.: 10/285,785

(22) Filed: Nov. 1, 2002

(65) Prior Publication Data

US 2004/0088128 A1 May 6, 2004

(51) Int. Cl.[7] ................................................ G06F 11/26
(52) U.S. Cl. ........................ 702/108; 702/117; 324/500
(58) Field of Search .............................. 702/108, 57–59, 702/64–67, 69, 75, 81, 117, 118, 119, 123, 124, 179; 714/718, 724, 721, 723; 365/201; 324/500, 512, 537, 765, 731

(56) References Cited

U.S. PATENT DOCUMENTS

| 6,023,777 | A | 2/2000 | Knaack | 714/718 |
|---|---|---|---|---|
| 6,079,038 | A | 6/2000 | Huston et al. | 714/724 |
| 6,418,387 | B1 | 7/2002 | Carney | 702/81 |
| 6,625,769 | B1 * | 9/2003 | Huott et al. | 714/733 |
| 2003/0093737 | A1 * | 5/2003 | Purtell et al. | 714/738 |
| 2003/0120451 | A1 * | 6/2003 | Thatcher et al. | 702/119 |

* cited by examiner

Primary Examiner—Hal Wachsman

(57) ABSTRACT

One embodiment comprises testing an electrical device using a combination of values of first and second parameters corresponding to a selected operating point comprising an origin of an R, θ polar coordinate plane; if the electrical device is determined to function in a passing manner at the selected operating point, updating the value of the polar coordinate R by incrementing the value thereof by a predetermined amount ΔR; otherwise, updating the value of the polar coordinate R by decrementing the value thereof by ΔR; if the updated value of the polar coordinate R is determined to be beyond an edge of a defined plot region, updating the value of the polar coordinate θ by a predetermined amount Δθ; and identifying an operating point corresponding to at least one of the updated values of the polar coordinates R and θ.

30 Claims, 11 Drawing Sheets

|      | 1.00 | 1.10 | 1.20 | 1.30 | 1.40 | 1.50 | 1.60 | 1.70 | 1.80 | 1.90 | 2.00 | 2.10 |
| ---- | ---- | ---- | ---- | ---- | ---- | ---- | ---- | ---- | ---- | ---- | ---- | ---- |
| 470  | ---  | ---  | ---  | ---  | ---  | ---  | ---  | ---  | ---  | ---  | ---  | XXX  |
| 500  | ---  |      |      |      |      |      |      |      |      |      | ---  | XXX  |
| 530  | ---  |      |      |      |      |      |      |      |      |      | ---  | XXX  |
| 560  | XXX  |      |      |      |      |      |      |      |      |      | ---  | XXX  |
| 590  | XXX  | ---  |      |      |      |      |      |      |      |      | ---  | XXX  |
| 620  | XXX  | ---  |      |      |      |      |      |      |      |      | ---  | XXX  |
| 650  | XXX  | ---  |      |      |      |      |      |      |      |      | ---  | XXX  |
| 680  | XXX  | XXX  | ---  |      |      |      |      |      |      |      | ---  | XXX  |
| 710  |      | XXX  | ---  |      |      |      |      |      |      |      | ---  | XXX  |
| 740  |      | XXX  | ---  |      |      |      |      |      |      |      | ---  | XXX  |
| 770  |      | XXX  | ---  |      |      |      |      |      |      |      | ---  | XXX  |
| 800  |      | XXX  | XXX  | ---  |      |      |      |      |      |      | ---  | XXX  |
| 830  |      |      | XXX  | ---  | ---  |      |      |      |      | ---  | ---  | XXX  |
| 860  |      |      |      | XXX  | ---  |      |      |      |      | ---  | XXX  |      |
| 890  |      |      |      | XXX  | ---  |      |      |      |      | ---  | XXX  |      |
| 920  |      |      |      | XXX  | ---  | ---  |      |      |      | ---  | XXX  |      |
| 950  |      |      |      |      | XXX  | ---  |      |      |      | ---  | XXX  |      |
| 980  |      |      |      |      |      | ---  |      |      |      | ---  | XXX  |      |
| 1010 |      |      |      |      |      | XXX  | ---  |      |      |      | XXX  |      |
| 1040 |      |      |      |      |      |      | XXX  | ---  | ---  | ---  | XXX  |      |
| 1070 |      |      |      |      |      |      |      | XXX  | ---  | XXX  |      |      |
| 1100 |      |      |      |      |      |      |      |      | XXX  |      |      |      |

KEY:
XXX = fail
--- = pass

FIG. 4E

| | 1.00 | 1.10 | 1.20 | 1.30 | 1.40 | 1.50 | 1.60 | 1.70 | 1.80 | 1.90 | 2.00 | 2.10 |
|---|---|---|---|---|---|---|---|---|---|---|---|---|
| 470 | [6] | [5] | [4] | [3] | [2] | [1] | [0] | [92] | [91] | [90] | [88] | [89] |
| 500 | [7] | | | | | | | | | | [86] | [87] |
| 530 | [8] | | | | | | | | | | [84] | [85] |
| 560 | [9] | | | | | | | | | | [83] | [82] |
| 590 | [10] | [11] | | | | | | | | | [80] | [81] |
| 620 | [12] | [13] | | | | | | | | | [78] | [79] |
| 650 | [14] | [15] | | | | | | | | | [76] | [77] |
| 680 | [16] | [17] | [18] | | | | | | | | [74] | [75] |
| 710 | | [19] | [20] | | | | | | | | [73] | [72] |
| 740 | | [22] | [21] | | | | | | | | [71] | [70] |
| 770 | | [24] | [23] | | | | | | | | [69] | [68] |
| 800 | | [25] | [26] | [27] | | | | | | | [67] | [66] |
| 830 | | | [28] | [29] | [31] | | | | | [63] | [64] | [65] |
| 860 | | | | [30] | [32] | | | | | [62] | [61] | |
| 890 | | | | [34] | [33] | | | | | [60] | [59] | |
| 920 | | | | [36] | [35] | [38] | | | | [57] | [58] | |
| 950 | | | | | [37] | [39] | | | | [56] | [55] | |
| 980 | | | | | | [40] | | | | [53] | [54] | |
| 1010 | | | | | | [41] | [42] | | | | [52] | |
| 1040 | | | | | | | [43] | [44] | [46] | [50] | [51] | |
| 1070 | | | | | | | | [45] | [47] | [49] | | |
| 1100 | | | | | | | | | [48] | | | |

KEY:
XXX = fail
--- = pass

SYSTEM AND METHOD FOR GENERATING A SHMOO PLOT BY TRACKING THE EDGE OF THE PASSING REGION

CROSS-REFERENCE TO RELATED APPLICATIONS

This application is related to U.S. patent application Ser. No.: 10/286,679; filed Nov. 1, 2002, entitled SYSTEM AND METHOD FOR GENERATING A SHMOO PLOT BY VARYING THE RESOLUTION THEREOF, currently pending; and U.S. patent application Ser. No.: 10/285,774; filed Nov. 1, 2002, entitled SYSTEM AND METHOD FOR GENERATING A SHMOO PLOT BY AVOIDING TESTING IN FAILING REGIONS currently pending.

BACKGROUND OF THE INVENTION

1. Technical Field of the Invention

The present invention generally relates to methods and systems for generating parametric test data for electrical devices. More particularly, and not by way of any limitation, the present invention is directed to method and system for generating a shmoo plot representative of such parametric data.

2. Description of Related Art

It is often necessary to characterize the performance of an electrical device with respect to certain operational parameters of the device. This characterization may be referred to as "parametric testing". One method by which to measure the performance of a device is on a pass/fail basis. A complete parametric test would provide a pass/fail result for every possible combination of all values of the operational parameters in question. This type of test provides users of the device information as to how the device will perform over a broad range of test conditions.

A shmoo plot is a graphical representation of the ability of an electrical device to operate properly in response to various combinations of values of two variable operating parameters, or "test conditions". For example, an integrated circuit ("IC") device might be repeatedly tested using different combinations of supply voltage and CPU clock signal frequency to determine the various test conditions in which the IC operates properly.

FIG. 1 illustrates a conventional shmoo plot 100. Each of the X- and Y-axes, designated 102(X) and 102(Y), respectively, represents the value of a test operating parameter. Continuing with the IC example set forth above, the X-axis 102(X) represents the value of supply voltage (Vcc) in units of volts ("V") and the Y-axis 102(Y) represents CPU clock signal frequency in units of megahertz ("Mhz"). To generate sufficient data to produce a useful shmoo plot, a device must be tested at an adequate number of combinations of X and Y operating parameter values within a range of interest bounded by Xmin, Xmax, Ymin, and Ymax, with some predetermined resolution in the X and Y interval size. Again, returning to the IC example, as illustrated in FIG. 1, Xmin and Xmax are 1.0 V and 2.1 V, respectively, while Ymin and Ymax are 470 Mhz and 1100 Mhz, respectively. The X and Y interval sizes are 0.1 V and 30 Mhz, respectively.

A "pass" symbol, represented in FIG. 1 by the symbol "---", is plotted when the device passes a test performed under the combination of operating parameters identified by the corresponding Cartesian (X, Y) coordinate pair. Similarly, a "fail" symbol, represented in FIG. 1 by the symbol "xxx", is plotted when the device fails a test performed under the combination of operating parameters identified by the corresponding Cartesian (X, Y) coordinate pair. In the IC example used herein, the IC is deemed to have "passed" if it functions correctly under a given set of test conditions.

As evidenced by the shmoo plot 100, shmoo plots provide a clear depiction of the operational limits of a device under various test conditions. A passing region 104 comprises the collection of passing points. A failing region 106 comprises the collection of failing points. An observer can easily note where the performance of the device transitions from the passing region 104 to the failing region 106 as the operating parameters are varied. It will be recognized, however, that a significant amount of time is required to perform the tests that form each of the individual array elements of a shmoo plot. In a simple 16×16 shmoo plot, assuming each test requires 100 µs to perform, the entire shmoo plot would require 16×16×100 µs, or 25.6 ms, to complete. Realistically, each operating parameter will be swept over a range of 100 values and each individual test could take on the order of a second to complete. Accordingly, a shmoo plot corresponding to such a parametric test would take nearly three hours to complete.

SUMMARY OF THE INVENTION

Accordingly, the present invention advantageously provides a system and method for more rapidly generating a shmoo plot for an electrical device by tracking the boundary between the pass/fail operating regions of the device.

One embodiment is a method of testing an electrical device to determine a range of combinations of values of first and second parameters for which the electrical device functions properly. The method comprises testing the electrical device using a combination of values of the first and second parameters corresponding to a selected operating point comprising an origin of an R, θ polar coordinate plane; if the electrical device is determined to function in a passing manner at the selected operating point, updating the value of the polar coordinate R by incrementing the value thereof by a predetermined amount ΔR; otherwise, updating the value of the polar coordinate R by decrementing the value thereof by ΔR; if the updated value of the polar coordinate R is determined to be beyond an edge of a defined clot region, updating the value of the polar coordinate θ by a predetermined amount Δθ; and identifying an operating point corresponding to at least one of the updated values of the polar coordinates R and θ.

BRIEF DESCRIPTION OF THE DRAWINGS

A more complete understanding of the present invention may be had by reference to the following Detailed Description when taken in conjunction with the accompanying drawings wherein:

FIGS. 4A–4F collectively illustrate method of generating a shmoo plot in accordance with the embodiment illustrated in FIG. 3 using a small value for Δθ; and FIGS. 5A and 5B illustrate a shmoo plot generated in accordance with the embodiment illustrated in FIG. 3 using a large value for Δθ.

DETAILED DESCRIPTION OF THE DRAWINGS

Figure 1:
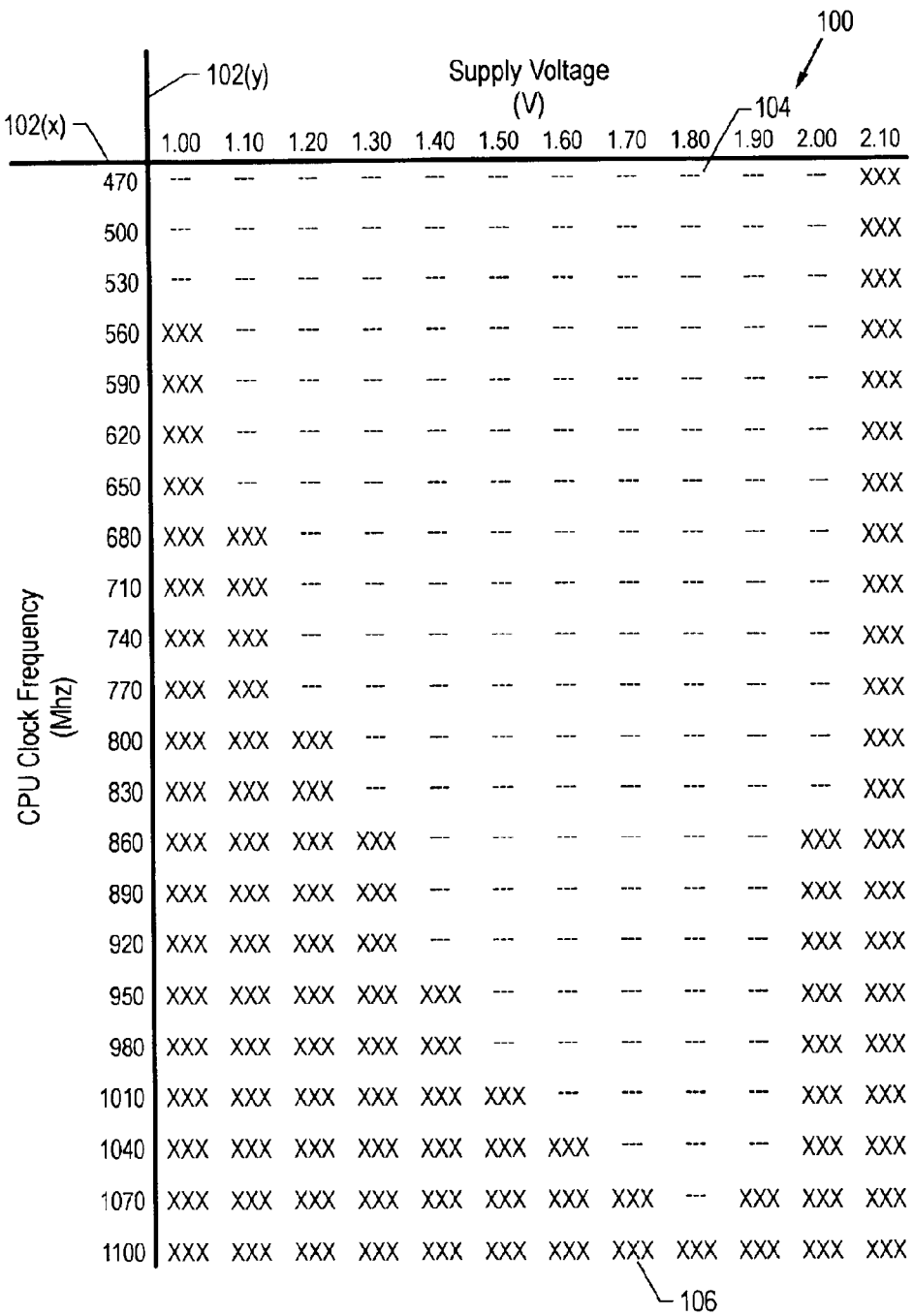
FIG. 1 illustrates a shmoo plot in accordance with the prior art.

In the drawings, like or similar elements are designated with identical reference numerals throughout the several views thereof, and the various elements depicted are not necessarily drawn to scale.

Figure 2:
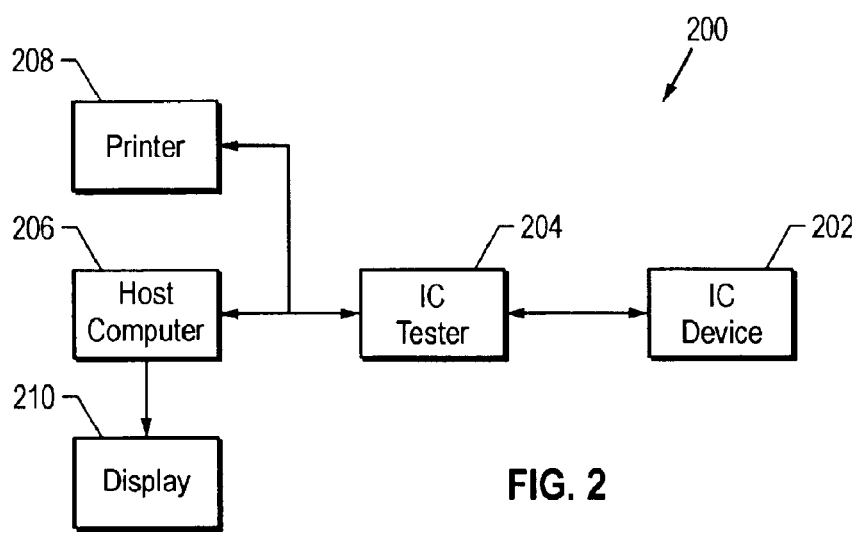
FIG. 2 is a block diagram of a system for generating a shmoo plot in accordance with one embodiment as set forth in FIG. 3 below.

FIG. 2 is a block diagram of a system 200 for generating a shmoo plot in accordance with one embodiment. The system 200 produces a shmoo plot indicating a range of values of a pair of operating parameters under which an IC device 202 can pass a predetermined test. The system 200 includes a conventional circuit tester 204 configurable by a host computer 206 via data and control signals sent to the tester 204. As will be recognized by one of ordinary skill in the art, the host computer 206 executes computer program instructions that dictate the operation thereof in accordance with the embodiments described herein. In accordance with one embodiment, the host computer 206 informs the tester 204 as to the value to which to set various operating parameters of the IC device 202. Once the tester 204 tests the IC device 202 under the prescribed operating parameters, it provides to the host computer 206 pass/fail data indicative of the performance of the IC device 202.

The host computer 206 utilizes the pass/fail data from the tester 204 to generate a shmoo plot, such as the one illustrated in FIG. 1, indicative of a performance envelope of the IC device 202. In one embodiment, the shmoo plot can be printed via a printer 208 and/or displayed on a display device 210 connected to the host computer 206.

In accordance with one embodiment, rather than configuring the tester 204 to test the IC device 202 for every combination of X and Y operating parameters between the specified maxima and minima, the host computer 206 configures the tester 204 to test the IC device 202 only at certain operating points, as described in detail below.

Figure 3:
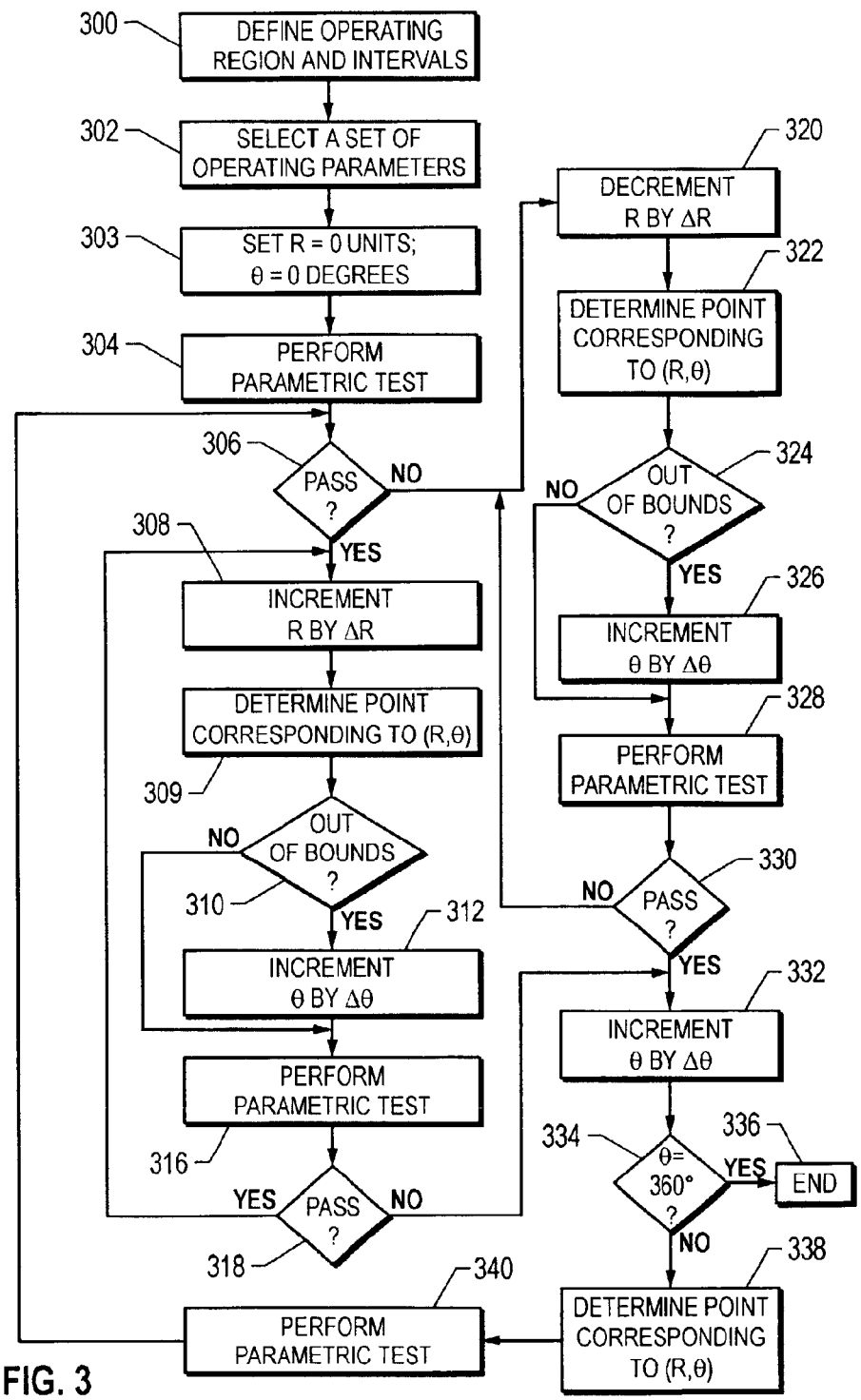
FIG. 3 is a flowchart illustrating operation of one embodiment of the present invention for generating a shmoo plot.

FIG. 3 is a flowchart of a method of operating the tester 204 to generate a shmoo plot by determining the edge of a concave passing region of a device in accordance with one embodiment. Generally, in one embodiment, the method of generating a shmoo plot as described herein involves viewing the shmoo plot in the polar coordinate plane, with a selected point as the origin of the plane.

In block 300, an operating region, or plot region, for the shmoo plot, including intervals at which the two operating parameters will be tested, is defined. For example, in the shmoo plot illustrated in FIG. 1, the operating region, or plot region, is defined by Xmin=1.0 V, Xmax=2.1 V, Ymin=470 Mhz, and Ymax=1100 Mhz, and X and Y operating interval sizes of 0.1 V and 30 Mhz, respectively.

In block 302, an operating point within the defined plot region is selected. In one embodiment, the point selected in block 302 is preferably a point that is likely to be designated as passing. In block 303, a radius R is set equal to zero grid units and an angle θ is set equal to zero degrees. In block 304, the tester 204 is caused to test the IC device 202 using the coordinates of the point selected in block 302 as operating parameters. In block 306, the tester determines whether the device 202 has passed or failed at the selected operating point. If the device 202 has passed, execution proceeds to block 308, in which the radius R is incremented by a predetermined amount ("ΔR"). In one embodiment, ΔR is equal to one grid unit. Execution then proceeds to block 309.

In block 309, the operating point corresponding to the polar coordinates (R, θ) is determined. It will be recognized that, due to their nature, the polar coordinates may not correspond directly to any one operating point, in which case, the nearest operating point within the defined plot region will be selected. In block 310, a determination is made whether the radius R extends "out of bounds", that is, beyond an edge of the defined plot region, in the direction identified by the angle θ. If so, execution proceeds to block 312, in which the angle θ is incremented by a predetermined amount ("Δθ"), and then to block 316. If a negative determination is made in block 310, execution proceeds directly to block 316.

In block 316, the tester 204 is caused to test the IC device 202 using the Cartesian (X, Y) coordinates of the point corresponding to the current polar coordinates (R, θ), as determined in block 309, as operating parameters. In block 318, the tester 204 determines whether the device 202 has passed at the selected operating point. If the device 202 has passed, execution returns to block 308; otherwise, execution proceeds to block 332, described below.

Returning to block 306, if the device 202 has failed, execution proceeds to block 320, in which the radius R is decremented by ΔR. In block 322, the operating point corresponding to the polar coordinates (R, θ) is determined. As indicated above, the polar coordinates may not correspond directly to any one operating point, in which case, the nearest operating point within the defined plot region will be selected. In block 324, a determination is made whether the radius R extends out of bounds in the direction identified by the angle θ. If so, execution proceeds to block 326, in which the angle θ is incremented by a predetermined amount ("Δθ"), and then to block 328. If a negative determination is made in block 324, execution proceeds directly to block 328.

In block 328, the tester 204 is caused to test the IC device 202 using the Cartesian (X, Y) coordinates of the point corresponding to the current polar coordinates (R, θ), as determined in block 322, as operating parameters. In block 330, the tester 204 determines whether the device 202 has passed at the selected operating point. If the device 202 has failed, execution returns to block 320; otherwise, execution proceeds to block 332.

In block 332, the angle θ is incremented by Δθ. In block 334, a determination is made whether θ=360 degrees. If so, execution terminates in block 336 and the shmoo plot is complete. Otherwise, execution proceeds to block 338, in which the point corresponding to the polar coordinates (R, θ) (or the nearest operating point thereto within the defined plot region) is determined, and then to block 340, in which the tester 204 is caused to test the IC device 202 using the Cartesian (X, Y) coordinates of the point corresponding to the current polar coordinates (R, θ), as determined in block 338, as operating parameters.

In one embodiment, a list of previously tested points will be maintained, preferably by the host computer 206, in order to avoid repeated testing of the same point. In one such embodiment, in situations in which it is determined that a current point has previously been tested, a point proximate the current point will be substituted therefor.

Figure 4A:
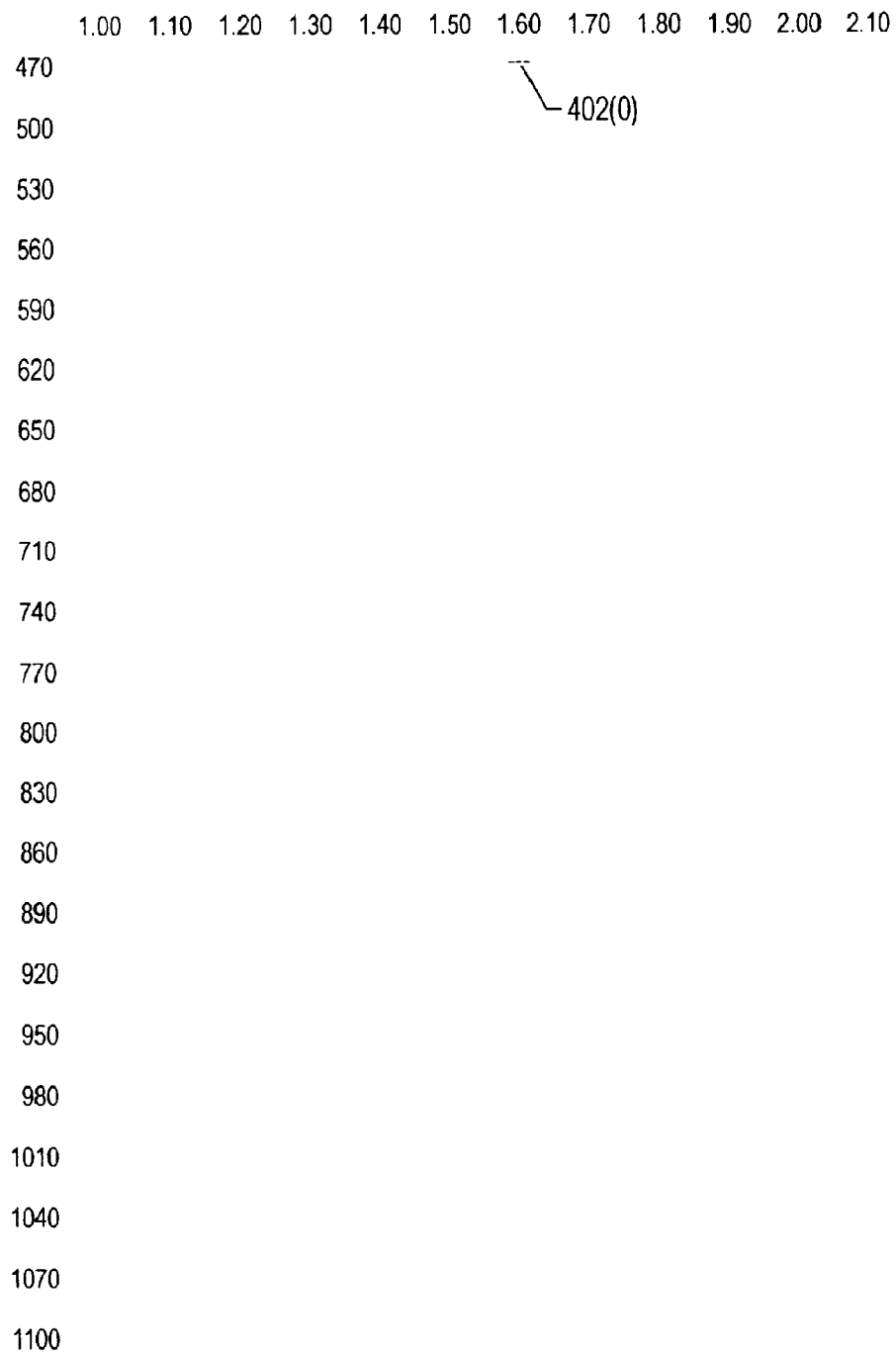

FIGS. 4A–4F illustrate generation of an exemplary shmoo plot 400 in accordance with one embodiment as illustrated in FIG. 3 in which the value of Δθ is small. As illustrated in FIG. 4A, in accordance with block 300 (FIG. 3), an operating region, or plot region, and X and Y intervals are defined. For purposes of illustration, the same plot region and X and Y intervals as those illustrated in FIG. 1 are employed for the shmoo plot 400.

Figure 4B:
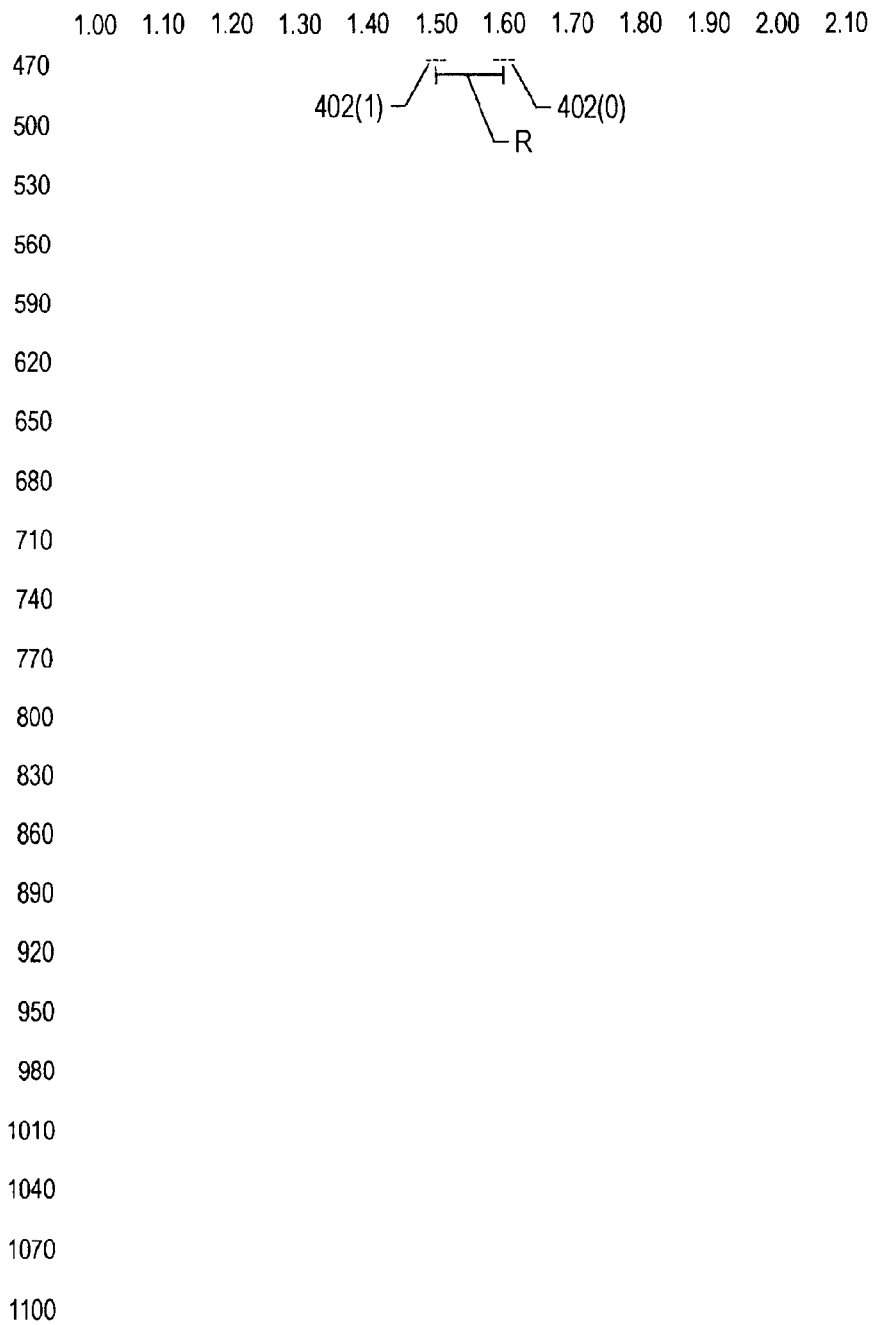
Figure 4C:
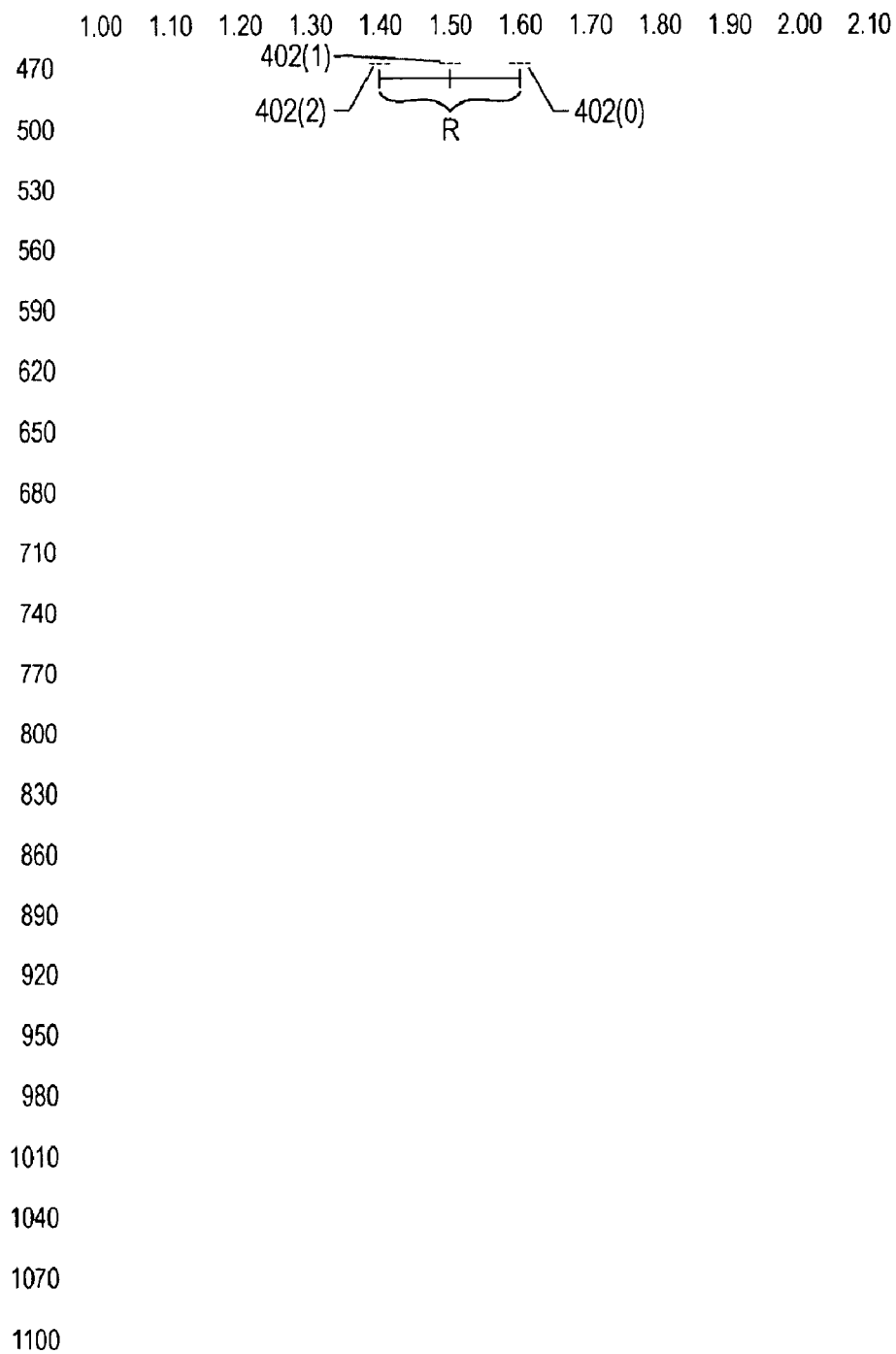

FIG. 4A illustrates the condition of the shmoo plot 400 after a first point 402(0), corresponding to the operating parameters 1.60 V and 470 Mhz and (polar coordinate pair (0, 0)), has been tested and plotted as a passing point. At this point, R is incremented by ΔR, which will be assumed for the sake of example to be one grid unit, θ remains zero, and a point corresponding to the new polar coordinate pair (1, 0) is determined and tested. As illustrated in FIG. 4B, this next point, designated by a reference numeral 402(1) corresponds to operating parameters 1.50 V and 470 Mhz. This point 402(1) also passes, so R is again incremented by ΔR and a point on the plot 400 corresponding to the new polar coordinate pair (2, 0) is determined and tested. As illustrated in FIG. 4C, this next point, designated by a reference numeral 402(2), corresponds to operating parameters 1.40 V and 470 Mhz.

Figure 4D:
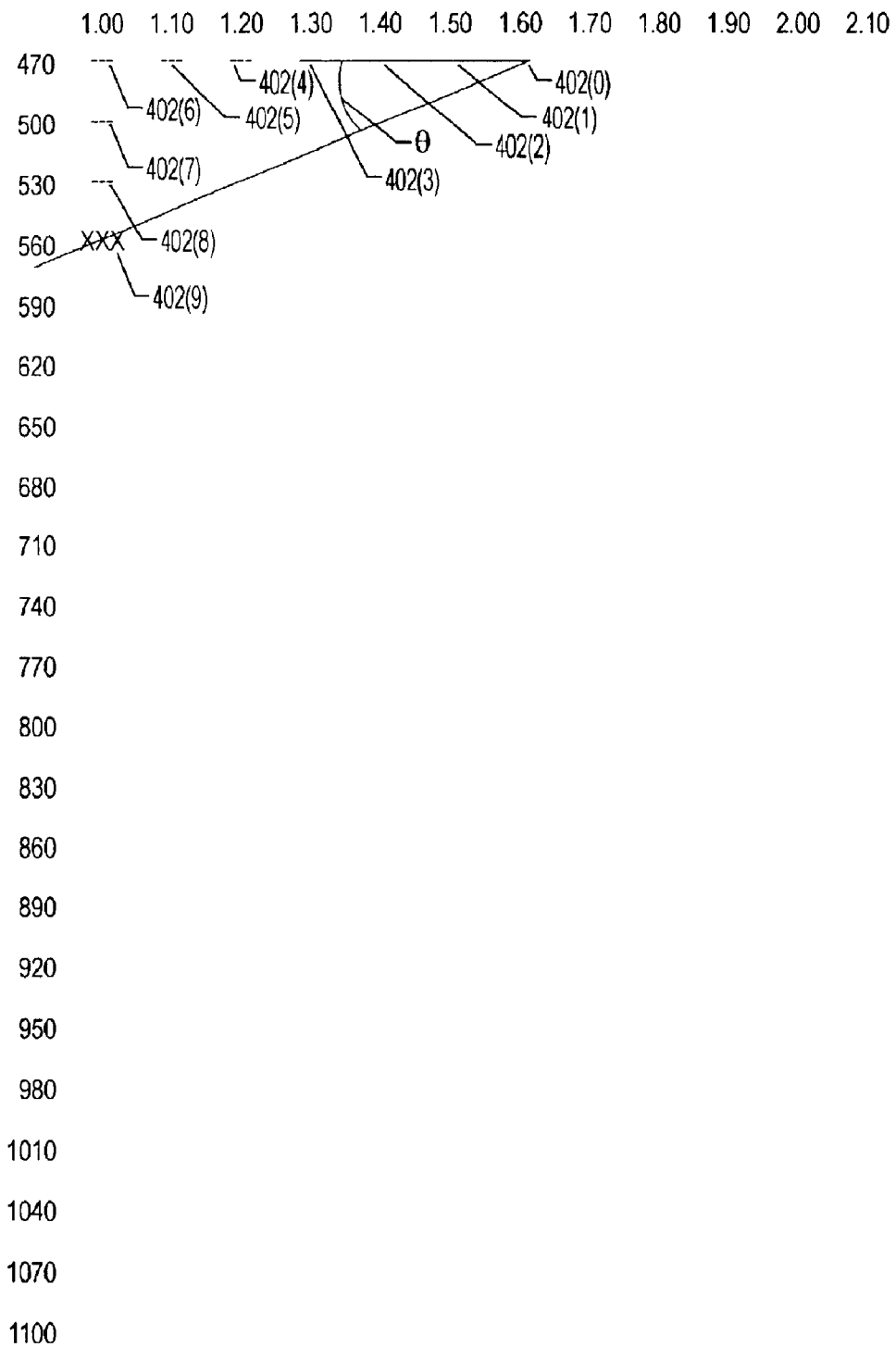

This process continues through passing points 402(3), 402(4), 402(5), and 402(6), which respectively corresponds to operating parameters 1.30 V and 470 Mhz, 1.20 V and 470 Mhz, 1.10 V and 470 Mhz, and 1.00 V and 470 Mhz, in that order, at which point the edge of the defined plot region is reached. Accordingly, after the point 402(6) is tested and plotted, both R (because the point is a passing point) and θ (because the edge of the plot region has been reached) are incremented to 7 and Δθ, respectively. Similarly, a point 402(7) corresponding to the current polar coordinate pair (7, Δθ) and to operating parameters 1.00 V and 500 Mhz also passes, so both R and θ are again incremented to 8 and 2Δθ, respectively. A point 402(8) corresponding to the current polar coordinates (8, 2Δθ) and to operating parameters 1.00 V and 530 Mhz also passes and R and θ are once again incremented to 9 and 3Δθ. As illustrated in FIG. 4D, the point corresponding to polar coordinates (9, 3Δθ) (point 402(9)) fails, so R will be decremented to 8. FIG. 4D also illustrates the angle θ, which in the subject example is equal to 3Δθ.

This process, as described in detail above with reference to FIG. 3, continues until the shmoo plot 400 is complete, as illustrated in FIG. 4E. FIG. 4F illustrates the completed shmoo plot 400; however, instead of an indication of whether the operating point tested passes or fails, each point contains an indication of the order in which the point was tested. Specifically, for each point, a number n enclosed in brackets indicates that the corresponding point was the (n+1)$^{th}$ point tested. For example, as illustrated in FIG. 4F, the point corresponding to (1.60, 470) was the first point ([0]) tested, the point corresponding to (1.00, 680) was the 17$^{th}$ ([16]) tested, the point corresponding to (1.70, 470) was the 93$^{rd}$ ([92]), and final, point tested.

Figure 5A:
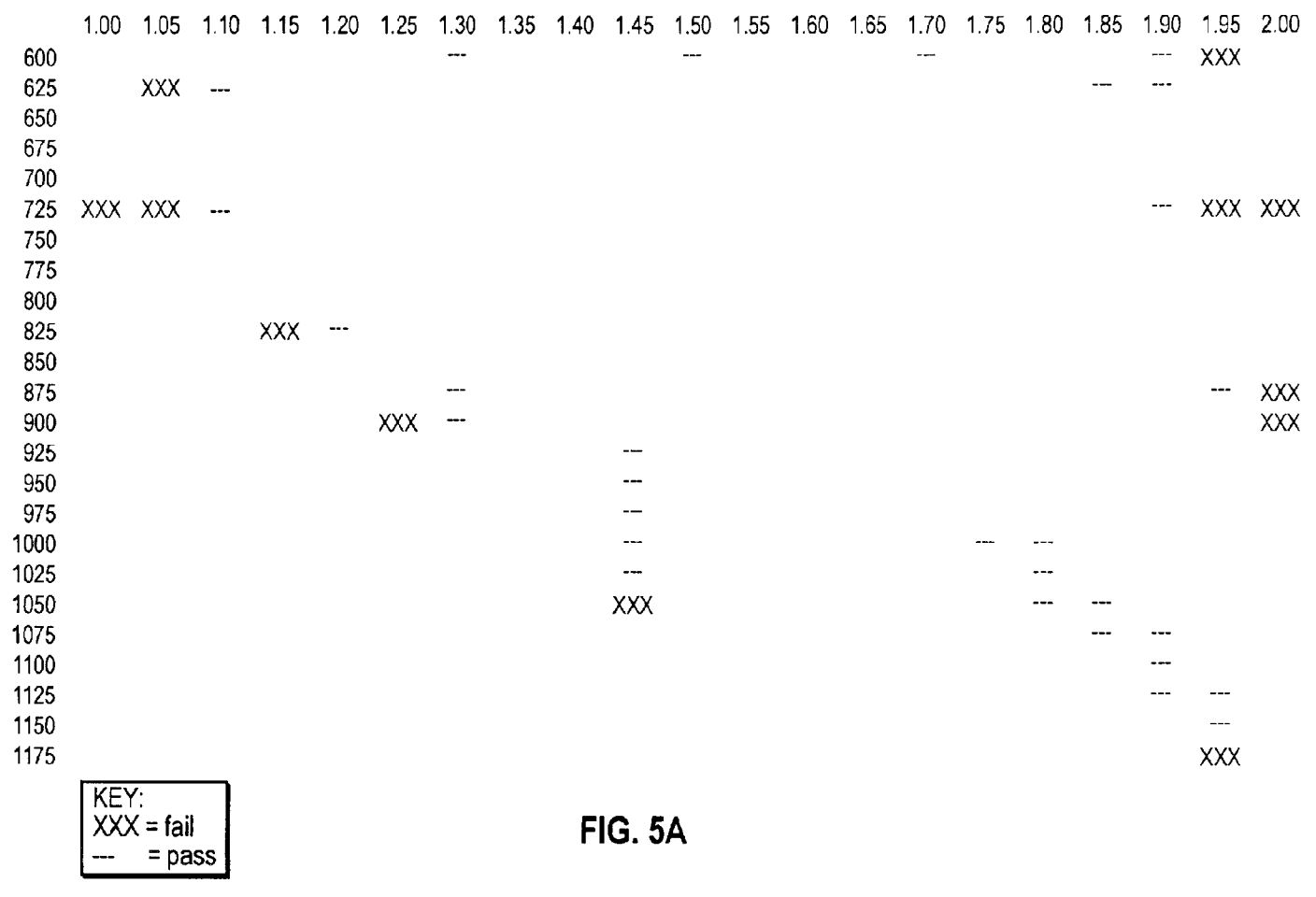

FIG. 5A illustrates a Shmoo plot 500 similar in all respects to the shmoo plots 100 and 400, except that different values for the maxima, minima, and intervals of the respective operational parameters (supply voltage and CPU clock speed) are employed. In particular, the plot region of the shmoo plot 500 is defined by Xmin=1.0 V, Xmax=2.0 V, Ymin=600, and Ymax=1175 Mhz, and X and Y operating interval sizes of 0.05 V and 25 Mhz, respectively. Additionally, a larger value for Δθ than that employed in generating the shmoo plot 400 is used to generate the shmoo plot 500, which accounts for the lower resolution and fewer points plotted on the plot 500. It will be noted that use of a large Δθ enables a shmoo plot to be generated more rapidly; however, it requires that points along the pass/fail boundary be interpolated. In contrast, use of a small Δθ requires more time to generate a shmoo plot, but results in a more clearly delineated pass/fail boundary.

Figure 5B:
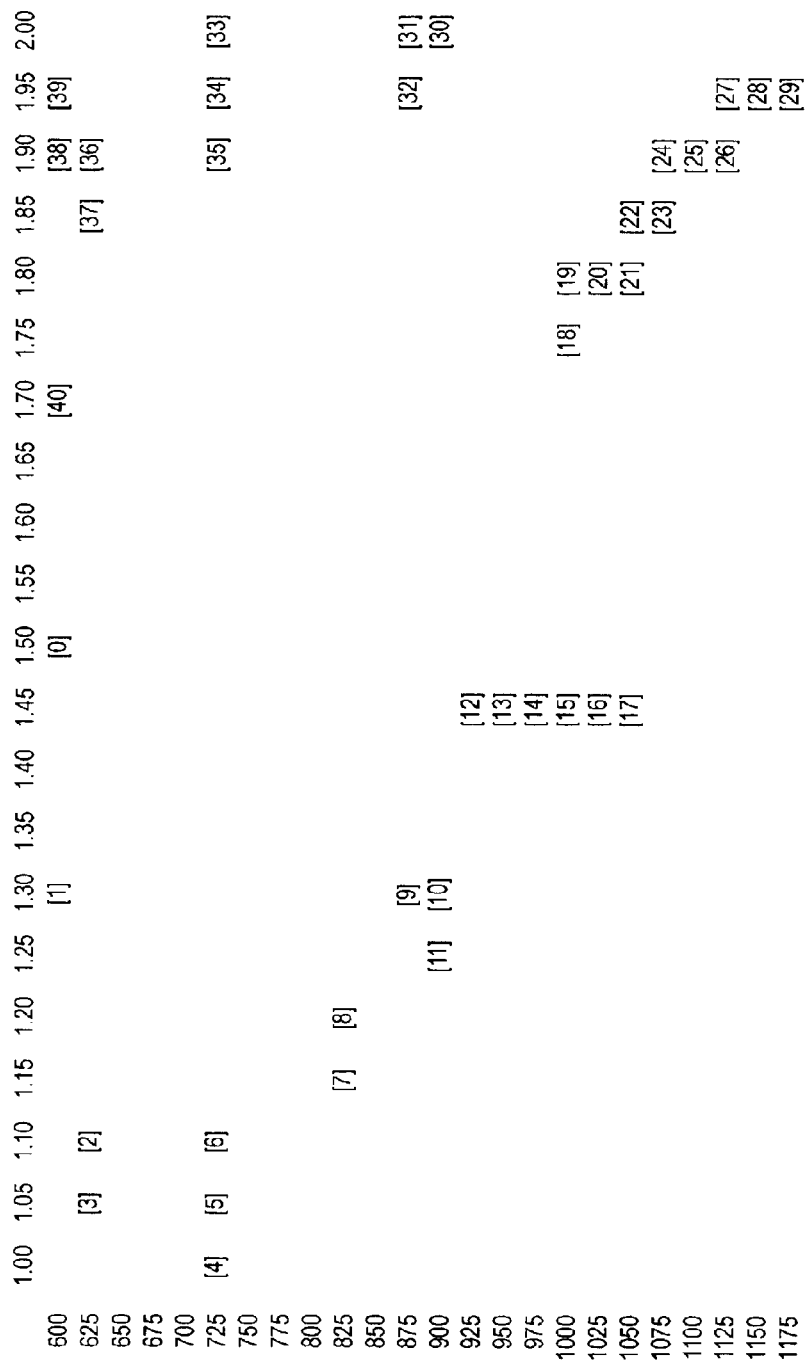

FIG. 5B is an alternative illustration of the completed shmoo plot 500; however, similar to the shmoo plot illustrated in FIG. 4F, instead of an indication of whether the operating point tested passes or fails, each point contains an indication of the order in which the point was tested. Specifically, for each point, a number n enclosed in brackets indicates that the corresponding point was the (n+1)$^{th}$ point tested. For example, as illustrated in FIG. 5B, the point corresponding to (1.50, 600) was the first point ([0]) tested, the point corresponding to (1.45, 1025) was the 17$^{th}$ ([16]) tested, the point corresponding to (1.70, 600) was the 41$^{st}$ ([40]), and final, point tested.

The embodiments of the invention described herein thus provide a method and system for more rapidly generating a shmoo plot representative of parametric test data with respect to an electrical device. It is believed that the operation and construction of the embodiments will be apparent from the foregoing Detailed Description thereof.

Although the invention has been described with reference to certain illustrations, it is to be understood that the embodiments of the invention shown and described are to be treated as exemplary embodiments only. Various changes, substitutions and modifications can be realized without departing from the spirit and scope of the invention as defined by the appended claims.

What is claimed is:

1. A method of testing an electrical device to determine a range of combinations of values of first and second parameters for which the electrical device functions properly, the method comprising:

testing the electrical device using a combination of values of the first and second parameters corresponding to a selected operating point comprising an origin of an R, θ polar coordinate plane;

if the electrical device is determined to function in a passing manner at the selected operating point, updating the value of the polar coordinate R by incrementing the value thereof by a predetermined amount ΔR; otherwise, updating the value of the polar coordinate R by decrementing the value thereof by ΔR;

if the updated value of the polar coordinate R is determined to be beyond an edge of a defined plot region in the R, θ polar coordinate plane, updating the value of the polar coordinate θ by a predetermined amount Δθ; and identifying an operating point corresponding to at least one of the updated values of the polar coordinates R and θ.

2. The method of claim 1 further comprising testing the electrical device using the values of the first and second parameters corresponding to the identified operating point.

3. The method of claim 2 further comprising, subsequent to completion of testing the electrical device using the values of the first and second parameters corresponding to the identified operating point, returning to the updating.

4. The method of claim 3 further comprising:

continuing the updating, identifying, and testing the electrical device using the values of the first and second parameters corresponding to the identified operating point until the electrical device functions differently at a successive identified operating point than at an immediately, preceding identified operating point; and responsive to the electrical device functioning differently at the successive identified operating point than at the immediately preceding identified operating point, incrementing the value of the polar coordinate θ by a predetermined amount Δθ.

5. The method of claim 4 further comprising, subsequent to the incrementing the value of the polar coordinate θ, returning to the identifying and testing the electrical device using the values of the first and second parameters corresponding to the identified operating point.

6. The method of claim 4 further comprising continuing the incrementing the value of the polar coordinate θ until the value thereof is equal to 360 degrees.

7. The method of claim 1 wherein the identifying an operating point corresponding to the at least one of the updated values of the polar coordinates R and θ comprises:
   locating a point designated by the at least one of the updated values of the polar coordinates R and θ;
   if the located operating point lies within a defined plot region, using the located point as the identified operating point; and
   if the located point lies outside of the defined plot region, using as the identified operating point an operating point that lies just within the defined plot region along a line defined by the updated value of the polar coordinate θ.

8. The method of claim 1 wherein the identifying an operating point corresponding to the at least one of the updated values of the polar coordinates R and θ comprises:
   locating a point designated by the at least one of the updated values of the polar coordinates R and θ; and
   using an operating point closest to the located point as the identified operating point.

9. The method of claim 1 wherein the passing manner of functioning of the electrical device is characterized by proper operation thereof and the manner other than the passing manner of functioning of the electrical device is characterized by a failure thereof to properly operate.

10. The method of claim 1 further comprising plotting results of the testing.

11. A system for testing an electrical device with respect to various combinations of values of first and second variable operating parameters to determine a range of combinations of values of the first and second variable operating parameters for which the electrical device functions properly, the system comprising:
   means for testing the electrical device using a combination of values of the first and second variable parameters corresponding to a selected operating point comprising an origin of an R, θ polar coordinate plane;
   means for updating the value of the polar coordinate R, wherein the means for updating increments the value of the polar coordinate R by a predetermined amount ΔR if the electrical device is determined to function in a passing manner at the selected operating point and decrements the value, of the polar coordinate R by ΔR if the electrical device functions other than in the passing manner at the selected operating point;
   means for updating the value of the polar coordinate θ by a predetermined amount Δθ, provided that the updated value of the polar coordinate R is determined to be beyond an edge of a defined plot region in the R, θ polar coordinate plane; and
   means for identifying an operating point corresponding to at least one of the updated values of the polar coordinates R and θ.

12. The system of claim 11 further comprising means for testing the electrical device using the values of the first and second variable operating parameters corresponding to the identified operating point.

13. The system of claim 12 further comprising:
   means responsive to the electrical device functioning differently at a successive identified operating point than at an immediately preceding identified operating point for incrementing the value of the polar coordinate θ by a predetermined amount Δθ.

14. The system of claim 11 wherein the means for identifying an operating point corresponding to the at least one of the updated values of the polar coordinates R and θ comprises:
   means for locating a point designated by the at least one of the updated values of the polar coordinates R and θ;
   means responsive to the located point lying within the defined plot region for using the located point as the identified operating point; and
   means responsive to the located point lying outside of the defined plot region for using as the identified operating point an operating point that lies just within the defined plot region along a line defined by the updated value of the polar coordinate θ.

15. The system of claim 11 wherein the means for identifying an operating point corresponding to the at least one of the updated values of the polar coordinates R and θ comprises:
   means for locating a point designated by the at least one of the updated values of the polar coordinates R and θ; and
   means for using an operating point closest to the located point as the identified operating point.

16. The system of claim 11 wherein the passing manner of functioning of the electrical device is characterized by proper operation thereof and the manner other than the passing manner of functioning of the electrical device is characterized by a failure thereof to properly operate.

17. The system of claim 11 further comprising means for plotting results of the testing.

18. A system for testing an electrical device with respect to various combinations of values of first and second variable operating parameters to determine a range of combinations of values of the first and second variable operating parameters for which the electrical device functions properly, the system comprising:
   a circuit tester connectable to the electrical device for testing the electrical device under prescribed operating conditions; and
   a computer connected to the circuit tester for controlling operation thereof, the computer testing the electrical device using a combination of values of the first and second variable operating parameters corresponding to a selected operating point comprising an origin of an R, θ polar coordinate plane; if the electrical device is determined to function in a passing manner at the selected operating point, updating the value of the polar coordinate R by incrementing the value thereof by a predetermined amount ΔR; otherwise, updating the value of the polar coordinate R by decrementing the value thereof by ΔR; if the updated value of the polar coordinate R is determined to be beyond an edge of a defined plot region in the R, θ polar coordinate plane, updating the value of the polar coordinate θ by a predetermined amount Δθ; and identifying an operating point corresponding to at least one of the updated values of the polar coordinates R and θ.

19. The system of claim 18 wherein the computer uses the values of the first and second variable operating parameters corresponding to the identified operating point, returning to the updating subsequent to completion of testing the electrical device.

20. The system of claim 19 wherein the computer continues the updating, identifying, and causing the circuit tester to test the electrical device using the values of the first arid second variable operating parameters corresponding to the identified operating point until the electrical device functions differently at a successive identified operating point than at an immediately preceding identified operating point, and, wherein responsive to the electrical device functioning differently at the successive identified operating point than at the immediately preceding identified operating point, the computer increments the value of the polar coordinate $\theta$ by a predetermined amount $\Delta\theta$.

21. The system of claim 20 wherein the computer returns to the identifying and testing the electrical device using the values of the first and second variable operating parameters corresponding to the identified operating point subsequent to the incrementing the value of the polar coordinate $\theta$.

22. The system of claim 20 wherein the computer continues the incrementing the value of the polar coordinate $\theta$ until the value thereof is equal to 360 degrees.

23. A computer-readable medium operable, with a computer to test an electrical device with respect to various combinations of values of first and second variable operating parameters to determine a range of combinations of values of the first and second variable operating parameters for which the electrical device functions properly, the medium having stored thereon:

instructions executable by the computer for testing the electrical device using a combination of values of the first and second variable operating parameters corresponding to a selected operating point comprising an origin of an R, $\theta$ polar coordinate plane;

instructions executable by the computer for updating the value of the polar coordinate R by incrementing the value thereof by a predetermined amount $\Delta R$ if the electrical device is determined to function in a passing manner at the selected operating point;

instructions executable by the computer for updating the valve of the polar coordinate R by decrementing the value thereof by $\Delta R$ if the electrical device functions in a manner other than the passing manner at the selected operating point;

instructions executable by the computer for updating the value of the polar coordinate e by a predetermined amount $\Delta\theta$ provided that the updated value of the polar coordinate R is determined to be beyond an edge of a defined plot region in the R, $\theta$ polar coordinate plane; and instructions executable by the computer for identifying an operating point corresponding to the updated values of the polar coordinates R and $\theta$.

24. The computer-readable medium of claim 23 further having stored thereon instructions executable by the computer for testing the electrical device using the values of the first and second variable operating parameters corresponding to the identified operating point.

25. The computer-readable medium of claim 24 further having stored thereon instructions executable by the computer for returning to the updating subsequent to completion of testing the electrical device.

26. The computer-readable medium of claim 25 further comprising:

instructions executable by the computer for continuing the updating, identifying, and testing the electrical device using the values of the first and second variable operating parameters corresponding to the identified operating point until the electrical device functions differently at a successive identified operating point than at an immediately preceding identified operating point; and instructions executable by the computer responsive to the electrical device functioning differently at the successive identified operating point than at the immediately preceding identified operating point for incrementing the value of the polar coordinate $\theta$ by a predetermined amount $\Delta\theta$.

27. The computer-readable medium of claim 26 further comprising instructions executable by the computer for returning to the identifying and testing the electrical device using the values of the first and second variable operating parameters corresponding to the identified operating point subsequent to the incrementing the value of the polar coordinate $\theta$.

28. The computer-readable medium of claim 26 further comprising instructions executable by the computer for continuing the incrementing the value of the polar coordinate $\theta$ until the value thereof is equal to 360 degrees.

29. The computer-readable medium of claim 23 wherein the instructions executable by the computer for identifying an operating point corresponding to the updated values of the polar coordinates R and $\theta$ comprise:

instructions executable by the computer for locating a point designated by the updated values of the polar coordinates R and $\theta$;

instructions executable by the computer responsive to the located point lying within the defined plot region for using the located point as the identified operating point; and instructions executable by the computer responsive to the located point lying outside of the defined plot region for using as the identified operating point an operating point that lies just within the defined plot region along a line defined by the updated value of the polar coordinate $\theta$.

30. The computer-readable medium of claim 23 wherein the instructions executable by the computer for identifying an operating point corresponding to the updated values of the polar coordinates R and $\theta$ comprise:

instructions executable by the computer for locating a point designated by the updated values of the polar coordinates R and $\theta$; and instructions executable by the computer for using an operating point closest to the located point as the identified operating point.

* * * * *

UNITED STATES PATENT AND TRADEMARK OFFICE
CERTIFICATE OF CORRECTION

PATENT NO. : 6,847,909 B2  Page 1 of 1
APPLICATION NO. : 10/285785
DATED : January 25, 2005
INVENTOR(S) : Christopher Todd Weller It is certified that error appears in the above-identified patent and that said Letters Patent is hereby corrected as shown below:

IN THE CLAIMS

Column 7, line 50, after "value" delete ","

Column 9, line 2, delete "arid" and insert therefor --and--

Column 9, line 42, delete "e" and insert therefor --θ--

Signed and Sealed this

Nineteenth Day of June, 2007

JON W. DUDAS
*Director of the United States Patent and Trademark Office*